United States Patent
Chen et al.

(10) Patent No.: US 7,649,829 B2
(45) Date of Patent: Jan. 19, 2010

(54) METHOD AND SYSTEM FOR REDUCTION OF DECODING COMPLEXITY IN A COMMUNICATION SYSTEM

(75) Inventors: Toa Chen, San Diego, CA (US); Paul E. Bender, San Diego, CA (US); Parag Agashe, San Diego, CA (US); Ramin Rezaiifar, San Diego, CA (US); Rajesh K. Pankaj, San Diego, CA (US); Yongbin Wei, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 713 days.

(21) Appl. No.: 09/976,591

(22) Filed: Oct. 12, 2001

(65) Prior Publication Data

US 2003/0072384 A1    Apr. 17, 2003

(51) Int. Cl.
H04J 11/00    (2006.01)
(52) U.S. Cl. .................. 370/203; 370/412; 370/535; 375/295; 375/340; 714/758; 714/784
(58) Field of Classification Search ................. 370/310, 370/310.1, 333, 400, 412, 413, 419, 493, 370/494, 495, 496, 529; 714/784, 799, 800
See application file for complete search history.

(56) References Cited

U.S. PATENT DOCUMENTS 4,750,167 A * 6/1988 Meyer ........................ 370/498

| | | | |
|---|---|---|---|
| 4,901,307 A | 2/1990 | Gilhousen et al. | 370/18 |
| 5,103,459 A | 4/1992 | Gilhousen et al. | 375/1 |

(Continued)

FOREIGN PATENT DOCUMENTS

EP    0 748 058 A2    12/1996

(Continued)

OTHER PUBLICATIONS

Lou et al., "Progressive Video Streaming Over 2G and 3G Wireless Systems," Proceedings of the 11$^{TH}$ IEEE International Symposium on Personal Indoor and Mobile Radio Communications, vol. 2, Sep. 18-21, 2000, London, pp. 1550-1554.

(Continued)

*Primary Examiner*—Chi H. Pham
*Assistant Examiner*—Shick Hom
(74) *Attorney, Agent, or Firm*—Pavel Kalousek; James K. O'Hare (57) ABSTRACT

Method and System for Utilization of an Outer Decoder in a Broadcast Services Communication System is described. Information to be transmitted is provided to a systematic portion of a plurality of transmit buffers and encoded by an outer decoder communicatively coupled to the transmit buffer. The resulting redundant bits are provided to a parity portion of each transmit buffer. The content of the transmit buffers, is multiplexed and encoded by an inner decoder to improve protection by adding redundancy. The receiving station recovers the transmitted information by an inverse process. Because a decoding complexity depends on the size of a systematic portion of the transmit buffer, reasoned compromise between a systematic portion size and number of transmit buffers yields decreased decoding complexity.

46 Claims, 3 Drawing Sheets

U.S. PATENT DOCUMENTS

| | | | | |
|---|---|---|---|---|
| 5,136,586 | A | * | 8/1992 | Greenblatt .................. 370/529 |
| 5,159,447 | A | * | 10/1992 | Haskell et al. ......... 375/240.05 |
| 5,351,087 | A | * | 9/1994 | Christopher et al. ........ 348/441 |
| 5,363,379 | A | * | 11/1994 | Eckenrode et al. .......... 714/703 |
| 5,412,655 | A | * | 5/1995 | Yamada et al. .............. 370/474 |
| 5,504,773 | A | | 4/1996 | Padovani et al. ............. 375/200 |
| 5,686,963 | A | * | 11/1997 | Uz et al. ................. 375/240.06 |
| 5,751,725 | A | | 5/1998 | Chen .......................... 371/5.5 |
| 5,774,496 | A | | 6/1998 | Butler et al. ................. 375/225 |
| 6,021,124 | A | * | 2/2000 | Haartsen ..................... 370/336 |
| 6,047,395 | A | | 4/2000 | Zook .......................... 714/756 |
| 6,052,812 | A | * | 4/2000 | Chen et al. .................. 714/751 |
| 6,148,010 | A | * | 11/2000 | Sutton et al. ................ 370/536 |
| 6,560,206 | B1 | * | 5/2003 | Naden et al. ............. 370/310.1 |
| 6,564,211 | B1 | | 5/2003 | Andreev et al. ................ 707/3 |
| 6,598,203 | B1 | * | 7/2003 | Tang .......................... 714/790 |
| 6,600,745 | B1 | * | 7/2003 | Chopping .................. 370/394 |
| 6,704,368 | B1 | * | 3/2004 | Nefedov ..................... 375/265 |
| 6,704,369 | B1 | * | 3/2004 | Kawasaki et al. ........... 375/285 |
| 6,798,791 | B1 | * | 9/2004 | Riazi et al. .................. 370/515 |
| 2001/0004761 | A1 | * | 6/2001 | Zehavi ....................... 714/784 |
| 2002/0080887 | A1 | * | 6/2002 | Jeong et al. ................. 375/295 |
| 2003/0035389 | A1 | | 2/2003 | Chen et al. .................. 370/331 |
| 2003/0101401 | A1 | * | 5/2003 | Salvi et al. .................. 714/755 |
| 2005/0144550 | A1 | * | 6/2005 | Jeon et al. ................... 714/755 |

FOREIGN PATENT DOCUMENTS

| | | |
|---|---|---|
| EP | 0 813 309 A2 | 12/1997 |
| EP | 1 032 150 A2 | 8/2000 |
| EP | 1 098 446 A2 | 5/2001 |
| JP | 2000-137551 | 5/2000 |
| JP | 2000-165258 | 6/2000 |

OTHER PUBLICATIONS

Kalliokulju, "Users Plane Architecture of $3_{rd}$ Generation Mobile Telecommunications Network," IEEE International Conference on Networks, Proceedings on Networks, Sep. 28, 1999, Brisbane, pp. 270-278.

TIA/EIA/IS-856 Interim Standard cdma2000 High Rate Packet Data Air Interface Specification (Nov. 2000).

TIA/EIA/IS-95-A (Revision of TIA/EIA/IS-95) Mobile Station-Base Station Compatibility Standard for Dual-Mode Wideband Spread Spectrum Cellular System (May 1995).

3GPP TS 25.211 V4.2.0 (Sep. 2001), 3rd Generation Partnership Project, Technical Specification Group Radio Access Network; Physical Channels and Mapping of Transport Channels Onto Physical Channels (FDD)(Release 4).

3GPP TS 25.212 V4.2.0 (Sep. 2001) 3rd Generation Partnership Project; Technical Specification Group Radio Access Network; Multiplexing and Channel Coding (FDD)(Release 4).

3G TS 25.213 V4.1.0 (Jun. 2001) 3rd Generation Partnership Project; Technical Specification Group Radio Access Network; Spreading and Modulation (FDD)(Release 4).

3GPP TS 25.214 V4.2.0 (Sep. 2001) 3rd Generation Partnership Project; Technical Specification Group Radio Access Network; Physical Layer Procedures (FDD)(Release 4).

3GPP2 C.S0002-0 Version 1.0 (Jul. 1999) 3rd Generation Partnership Project 2 "3GPP2" Physical Layer Standard for cdma2000 Spread Spectrum Systems.

* cited by examiner

METHOD AND SYSTEM FOR REDUCTION OF DECODING COMPLEXITY IN A COMMUNICATION SYSTEM

BACKGROUND

1. Field

The present invention relates to communication systems. More particularly, the present invention relates to a system and method for reduction of decoding complexity in a communication system.

2. Background

Communication systems have been developed to allow transmission of information signals from an origination station to a physically distinct destination station. In transmitting information signal from the origination station over a communication channel, the information signal is first converted into a form suitable for efficient transmission over the communication channel. Conversion, or modulation, of the information signal involves varying a parameter of a carrier wave in accordance with the information signal in such a way that the spectrum of the resulting modulated carrier is confined within the communication channel bandwidth. At the destination station the original information signal is replicated from the modulated carrier wave received over the communication channel. Such a replication is generally achieved by using an inverse of the modulation process employed by the origination station.

Modulation also facilitates multiple-access, i.e., simultaneous transmission and/or reception, of several signals over a common communication channel. Multiple-access communication systems often include a plurality of subscriber units requiring intermittent service of relatively short duration rather than continuous access to the common communication channel. Several multiple-access techniques are known in the art, such as time division multiple-access (TDMA), frequency division multiple-access (FDMA), and amplitude modulation multiple-access (AM). Another type of a multiple-access technique is a code division multiple-access (CDMA) spread spectrum system that conforms to the "TIA/EIA/IS-95 Mobile Station-Base Station Compatibility Standard for Dual-Mode Wide-Band Spread Spectrum Cellular System," hereinafter referred to as the IS-95 standard. The use of CDMA techniques in a multiple-access communication system is disclosed in U.S. Pat. No. 4,901,307, entitled "SPREAD SPECTRUM MULTIPLE-ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention.

A multiple-access communication system may be a wireless or wire-line and may carry voice and/or data. An example of a communication system carrying both voice and data is a system in accordance with the IS-95 standard, which specifies transmitting voice and data over the communication channel. A method for transmitting data in code channel frames of fixed size is described in detail in U.S. Pat. No. 5,504,773, entitled "METHOD AND APPARATUS FOR THE FORMATTING OF DATA FOR TRANSMISSION", assigned to the assignee of the present invention. In accordance with the IS-95 standard, the data or voice is partitioned into code channel frames that are 20 milliseconds wide with data rates as high as 14.4 Kbps. Additional examples of a communication systems carrying both voice and data comprise communication systems conforming to the "3rd Generation Partnership Project" (3GPP), embodied in a set of documents including Document Nos. 3G TS 25.211, 3G TS 25.212, 3G TS 25.213, and 3G TS 25.214 (the W-CDMA standard), or "TR-45.5 Physical Layer Standard for cdma2000 Spread Spectrum Systems" (the IS-2000 standard).

An example of a data only communication system is a high data rate (HDR) communication system that conforms to the TIA/EIA/IS-856 industry standard, hereinafter referred to as the IS-856 standard. This HDR system is based on a communication system disclosed in co-pending application Ser. No. 08/963,386, entitled "METHOD AND APPARATUS FOR HIGH RATE PACKET DATA TRANSMISSION," filed Nov. 3, 1997, now issued as U.S. Pat. No. 6,564,211, and assigned to the assignee of the present invention. The HDR communication system defines a set of data rates, ranging from 38.4 kbps to 2.4 Mbps, at which an access point (AP) may send data to a subscriber station (access terminal, AT). Because the AP is analogous to a base station, the terminology with respect to cells and sectors is the same as with respect to voice systems.

In a multiple-access communication system, communications between users are conducted through one or more base stations. A first user on one subscriber station communicates to a second user on a second subscriber station by transmitting data on a reverse link to a base station. The base station receives the data and can route the data to another base station. The data is transmitted on a forward link of the same base station, or the other base station, to the second subscriber station. The forward link refers to transmission from a base station to a subscriber station and the reverse link refers to transmission from a subscriber station to a base station. Likewise, the communication can be conducted between a first user on one subscriber station and a second user on a landline station. A base station receives the data from the user on a reverse link, and routes the data through a public switched telephone network (PSTN) to the second user. In many communication systems, e.g., IS-95, W-CDMA, IS-2000, the forward link and the reverse link are allocated separate frequencies.

The above described wireless communication service is an example of a point-to-point communication service. In contrast, broadcast services provide point-to-multipoint communication service. The basic model of a broadcast system consists of a broadcast net of users served by one or more central stations, which transmit information with a certain contents, e.g., news, movies, sports events and the like to the users. Each broadcast net user's subscriber station monitors a common broadcast forward link signal. Because the central station fixedly determines the content, the users are generally not communicating back. Examples of common usage of broadcast services communication systems are TV broadcast, radio broadcast, and the like. Such communication systems are generally highly specialized purpose-build communication systems. With the recent, advancements in wireless cellular telephone systems there has been an interest of utilizing the existing infrastructure of the—mainly point-to-point cellular telephone systems for broadcast services. (As used herein, the term "cellular" systems encompasses communication systems utilizing both cellular and PCS frequencies.)

The information signal to be exchanged among the terminals in a communication system is often organized into a plurality of packets. For the purposes of this description, a packet is a group of bytes, including data (payload) and control elements, arranged into a specific format. The control elements comprise, e.g., a preamble and a quality metric. The quality metric comprises, e.g., cyclical redundancy check (CRC), parity bit(s), and other types of metric known to one skilled in the art. The packets are then formatted to fit a into a frame in accordance with a communication channel structure. The frame, appropriately modulated, traveling between the origination terminal and the destination terminal, is affected by characteristics of the communication channel, e.g., signal-to-noise ratio, fading, time variance, and other such characteristics. Such characteristics affect the modulated signal differently in different communication channels. Consequently, transmission of a modulated signal over a wireless communication channel requires different considerations than transmission of a modulated signal over a wire-like communication channel, e.g., a coaxial cable or an optical cable. In addition to selecting modulation appropriate for a particular communication channel, other methods for protecting the information signal have been devised. Such methods comprise, e.g., encoding, symbol repetition, interleaving, and other methods know to one of ordinary skill in the art. However, these methods increase overhead. Therefore, an engineering compromise between reliability of the information signal delivery and the amount of overhead must be made. Even with the above-discussed protection of information signal, the conditions of the communication channel can degrade to the point at which the destination station possibly cannot decode (erases) some of the packets. In data—only communications systems allowing a communication of a feedback from a destination terminal to the origination terminal, one cure is to re-transmit the non-decoded packets using an Automatic Retransmission reQuest (ARQ) made by the destination station to the origination station. However, under certain conditions, the ARQ may overload the communication system. Furthermore, as discussed in regards to broadcast communication systems, the subscribers do not communicate back to the base station. Consequently, other means of information protection are desirable.

Figure 1:
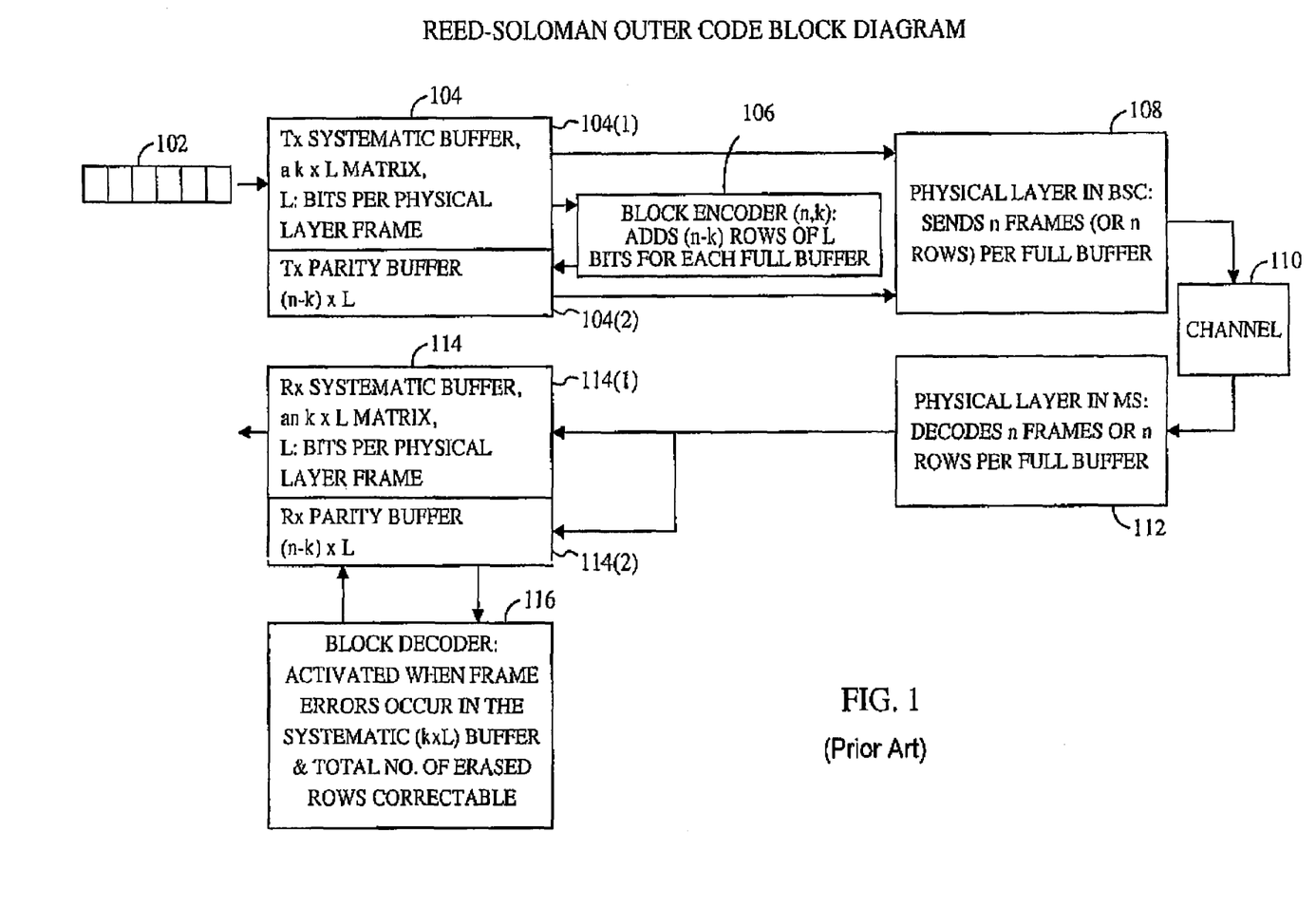
FIG. 1 illustrates prior art physical layer processing.
Figure 2:
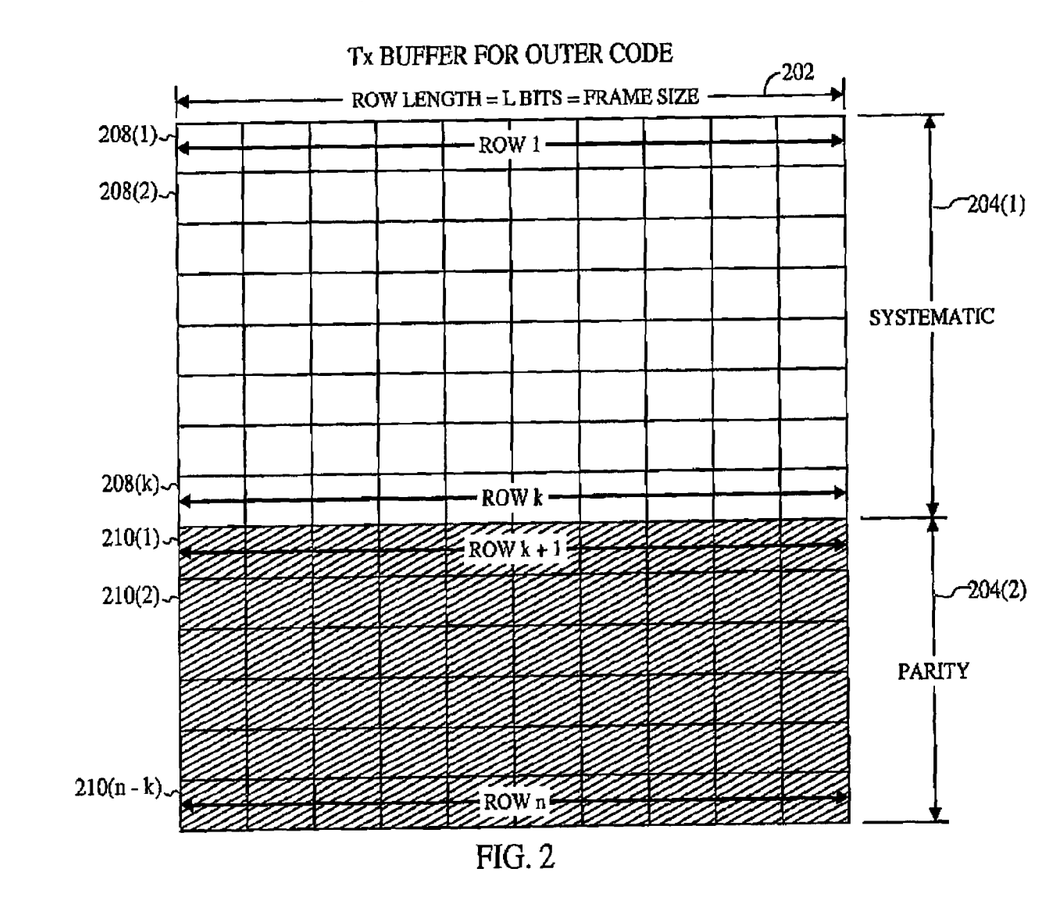
FIG. 2 illustrates a transmit buffer.

A co-pending application Ser. No. 09/933,912, entitled "METHOD AND SYSTEM FOR UTILIZATION OF AN OUTER DECODER IN A BROADCAST SERVICES COMMUNICATION SYSTEM," filed Aug. 20, 2001, and assigned to the assignee of the present invention, discussed in detail utilization of an outer decoder in a broadcast system. As described in the co-pending application Ser. No. 09/933,912, the bit stream of information to be transmitted is first encoded by an outer decoder and the encoded stream is then encoded by an inner encoder. As illustrated in FIG. 1, the bit stream of information to be transmitted 102, originating at higher layers, is provided to a transmit buffer 104. The transmit buffer is illustrated in more detail in FIG. 2. The total number of rows in the transmit buffer is equal to n, comprising k systematic rows and (n−k) parity rows. Referring to FIG. 2, the bits fill the systematic portion 204(1) of the transmit buffer 104 (of FIG. 1) row by row from left to right. The systematic portion 204(1) comprises k rows 208 of length L. Referring back to FIG. 1, once the systematic portion 204(4) (of FIG. 2) is full, the outer block encoder 106 is activated to perform column-wise encoding of the bits in the systematic portion 204(1) (of FIG. 2) to generate (n−k) additional rows 210 (of FIG. 2) of parity bits. m is the number of bits used to code an m-bit symbol. This column-wise operation is performed column by column for binary outer code, i.e., m=1. For non-binary code, i.e., m>1, every m adjacent columns in a row are treated as a m-bit symbol. The m-bit symbols along the top k rows are read by the outer encoder to produce n−k m-bit symbols that fill the corresponding lower n−k rows of these columns.

The outer encoder comprises, e.g., a systematic Reed-Solomon (R-S) encoder. Referring back to FIG. 1, the content of the transmit buffer 104 is then provided to a physical layer 108. At the physical layer 108, the individual frames are encoded by an inner encoder (not shown), which results in encoded frames. The structure of the inner decoder may be well known to one of ordinary skills in the art. The systematic rows and the parity rows of the buffer may be interlaced during transmission to reduce the chance of large number of systematic rows erased when the total number of inner code erasure exceeds the outer code's correcting capability. The frames are further processed in accordance with a selected modulation scheme, e.g., cdma2000, WCDMA, UMTS, and other modulation schemes known to one of ordinary skills in the art. The processed frames are then transmitted over a communication channel 110.

The transmitted frames are received at the destination station and provided to a physical layer 112. At the physical layer 112, the individual frames are demodulated and provided to an inner decoder (not shown). The inner decoder decodes each frame, and if the decoding is successful, outputs a correctly decoded frame; or if the decoding is unsuccessful, declares an erasure. The success or failure of decoding must be determined with a high accuracy, achieved e.g., by including a long (for example, 16-bit) cyclic redundancy check (CRC) in the frame after outer encoding and before inner encoding. The included CRC obtained from the decoded frame is compared with a CRC calculated from the bits of the decoded frame, and if the two CRCs are identical, the decoding is declared successful.

If the inner decoder cannot decode the frame, the decoder declares an erasure, and provides an outer block decoder 116 with an indication that the frame is missing. The process continues until there are as many parity frames received correctly and passed to a parity portion 114(2) of a receive buffer 114, as there are erased systematic frames. The receiver stops the reception of any remaining frames and the outer decoder (not shown) is activated to recover the erased systematic frames. The recovered systematic frames are passed to the upper layer.

It is well known in the art that a decoding/error correcting computation complexity increases with increased values of the number of rows in the transmit buffer 104. Because the decoding/error correcting computation complexity affects hardware complexity at the receiving terminal as well as power consumption, there exists a need in the art for a method and system.

SUMMARY

Embodiments disclosed herein address the above stated needs by providing a method and a system executing the method by encoding systematic bits in each of a plurality of buffers with an outer code; multiplexing content of the plurality of buffers; and encoding said multiplexed content with an inner code to provide a set of frames.

In another aspect of the invention, the received set of frames is decoded by an inner decoder; the correctly decoded frames are de-multiplexed to a plurality of buffers; and the content of each buffer is further processed. If the systematic portion of a buffer has been decoded correctly, the processing comprises providing the content of the systematic portion to higher layers. Alternatively, if it is determined that decoding of the buffer content by an outer decoder recovers the systematic portion, the outer decoder is activated and the recovered content together with the correctly received content of the systematic portion are provided to higher layers.

DETAILED DESCRIPTION

Definitions

The word "exemplary" is used herein to mean "serving as an example, instance, or illustration." Any embodiment described herein as "exemplary" is not necessarily to be construed as preferred or advantageous over other embodiments.

The terms point-to-point communication is used herein to mean a communication between two subscriber stations over a dedicated communication channel.

The terms broadcast communication or point-to-multipoint communication are used herein to mean a communication wherein a plurality of subscriber stations are receiving communication from one source.

The term packet is used herein to mean a group of bits, including data (payload) and control elements, arranged into a specific format. The control elements comprise, e.g., a preamble, a quality metric, and others known to one skilled in the art. Quality metric comprises, e.g., a cyclical redundancy check (CRC), a parity bit, and others known to one skilled in the art.

The term access network is used herein to mean a collection of base stations (BS) and one or more base stations' controllers. The access network transports data packets between multiple subscriber stations. The access network may be further connected to additional networks outside the access network, such as a corporate intranet or the Internet, and may transport data packets between each access terminal and such outside networks.

The term base station is used herein to mean the hardware with which subscriber stations communicate. Cell refers to the hardware or a geographic coverage area, depending on the context in which the term is used. A sector is a partition of a cell. Because a sector has the attributes of a cell, the teachings described in terms of cells are readily extended to sectors.

The term subscriber station is used herein to mean the hardware with which an access network communicates. A subscriber station may be mobile or stationary. A subscriber station may be any data device that communicates through a wireless channel or through a wired channel, for example using fiber optic or coaxial cables. A subscriber station may further be any of a number of types of devices including but not limited to PC card, compact flash, external or internal modem, or wireless or wireline phone. A subscriber station that is in the process of establishing an active traffic channel connection with a base station is said to be in a connection setup state. A subscriber station that has established an active traffic channel connection with a base station is called an active subscriber station, and is said to be in a traffic state.

The term physical channel is used herein to mean a communication route over which a signal propagates described in terms of modulation characteristics and coding.

The term logical channel is used herein to mean a communication route within the protocol layers of either the base station or the subscriber station.

The term communication channel/link is used herein to mean a physical channel or a logical channel in accordance with the context.

The term reverse channel/link is used herein to mean a communication channel/link through which the subscriber station sends signals to the base station.

A forward channel/link is used herein to mean a communication channel/link through which a base station sends signals to a subscriber station.

The term soft hand-off is used herein to mean a communication between a subscriber station and two or more sectors, wherein each sector belongs to a different cell. The reverse link communication is received by both sectors, and the forward link communication is simultaneously carried on the two or more sectors' forward links.

The term softer hand-off is used herein to mean a communication between a subscriber station and two or more sectors, wherein each sector belongs to the same cell. The reverse link communication is received by both sectors, and the forward link communication is simultaneously carried on one of the two or more sectors' forward links.

The term erasure is used herein to mean failure to recognize a message.

The term dedicated channel is used herein to mean a channel modulated by information specific to an individual subscriber station.

The term common channel is used herein to mean a channel modulated by information shared among all subscriber stations.

The term physical layer is used exclusively herein to mean that part of the communication protocol between an origination terminal and a destination terminal that is responsible for the transmission an reception of data. The physical layer corresponds to Layer 1 in the International Standards Organization model for Open System Interconnection.

The term higher layer(s) is used exclusively herein to mean that part of the communication protocol between an origination terminal and a destination terminal that is above a physical layer. The higher layers correspond to Layers 2 through 7 in the International Standards Organization model for Open System Interconnection.

Description

Figure 3:
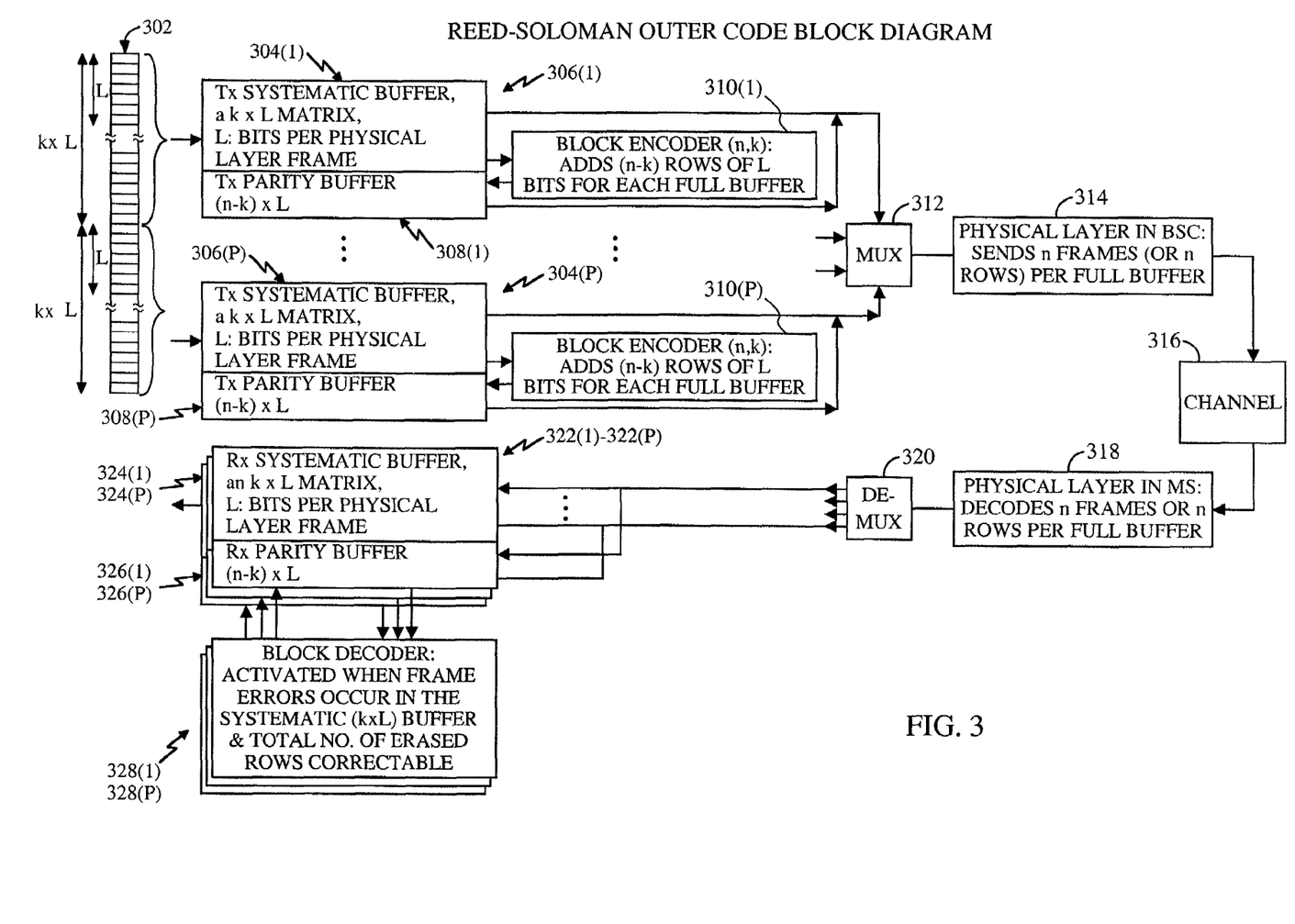
FIG. 3 illustrates physical layer processing in accordance with one embodiment of the invention.

In accordance with one embodiment of the present invention, as illustrated in FIG. 3, the bit stream of information to be transmitted 302, originating at higher layers, is de-multiplexed and provided to transmit buffers 304($i$). The bits fill the systematic portion 306(1) of the transmit buffer 304(1) row by row from left to right. The systematic portion 306(1) comprises k rows of length L. In one embodiment, the length L of the buffer coincides with the length of a radio frame without the overhead (e.g., CRC to help the inner decoder and the tail bits for the inner encoder). Once the systematic portion 306(1) of the transmit buffer 304(1) is full, the procedure is repeated for the remaining transmit buffers 304(2)-304($p$). Once the systematic portions 306($i$) of the transmit buffers 304($i$) are full, the outer block encoders 310($i$) are activated to perform column-wise encoding of the bits in the systematic portion 306($i$) to generate (n-k) additional rows of parity bits 308($i$). This column-wise operation is performed column by column for binary outer code, i.e., m=1. For non-binary code, i.e., m>1, every m adjacent columns in a row are treated as a m-bit symbol. The m-bit symbols along the top k rows are read by the outer encoder to produce n-k m-bit symbols that fill the corresponding lower n-k rows of these columns.

In another embodiment, the length L of the buffer is equal to the number of bits the radio frame without the overhead divided by m, the dimension of the outer encoder code. In this embodiment, the first m rows from the transmit buffers 304($i$) are sent in the first radio frame, the second m rows of bits are sent in the second radio frame, until the entire buffer is transmitted. Once the systematic portion 306(1) of the transmit buffer 304(1) is full, the procedure is repeated for the remaining transmit buffers 304(2)-304($p$). Once the systematic portions 306($i$) of the transmit buffers 304($i$) are full, the outer block encoders 310($i$) are activated to perform column-wise encoding of the bits in the systematic portion 304(i) to generate m(n–k) additional rows of parity bits 308(i). This column-wise operation is performed column by column for binary outer code, i.e., m=1. For non-binary code, i.e., m>1, every m-rows of a column form a m-bit symbol. The k symbols from the top k m rows in the column are read by the outer encoder to produce (n–k) m-bit symbols that fill the corresponding lower m(n–k) rows of this column.

In one embodiment the outer encoders 310(i) comprise a systematic Reed-Solomon (R-S) encoder. The content of the transmit buffers 304(i) are then provided to an multiplexer 312. The multiplexer 312 cycles through the transmit buffers 304(1)-304(p), selecting a successive transmit buffer 304(i) after a block of bits containing a pre-determined number of bits has been sent form a previous buffer 304(i-1). In one embodiment, the pre-determined number of bits in a block equals L. This strategy intends to uniformly distribute corruption of data caused by disturbance of a physical channel 316 among the buffers 304(i). However, one of ordinary skills in the art understands that other multiplexing strategies are equally applicable, and can be utilized without departing from the spirit or scope of the invention. The multiplexed blocks of bits are provided to a physical layer 314 of the originating terminal. At the physical layer 314, additional overhead bits (e.g., a CRC check) are added to each of the blocks of bits, and the resulting structure is encoded by an inner encoder (not shown), which results in encoded frames. The structure of the outer and inner encoders and the multiplexer may be, e.g., the structure of FIG. 3. The frames are further processed in accordance with a selected modulation scheme. In one embodiment, the processing is performed in accordance with the IS-2000 standard. The processed frames are then transmitted over a communication channel 316.

The transmitted frames are received at the destination station (not shown), and provided to a physical layer 318 at the destination station. At the physical layer 318, the individual frames are demodulated and provided to an inner decoder (not shown). In one embodiment, the inner decoder decodes each frame, and if the decoding is successful, outputs a correctly decoded frame; or if the decoding is unsuccessful, declares an erasure. The success or failure of decoding must be determined with a high accuracy. In one embodiment, the accuracy is achieved by including a long (for example, 16-bit) cyclic redundancy check (CRC) in the frame after outer encoding and before inner encoding as discussed above. However, one of ordinary skills in the art recognizes that other mechanisms for frame quality indication may be used. The included CRC obtained from the decoded frame is compared with a CRC calculated from the bits of the decoded frame, and if the two CRCs are identical, the decoding is declared successful. Further processing at the physical layer proceeds in accordance with the result of the inner decoder decision.

The correctly decoded frames are provided to a de-multiplexer 320 that distributes the correctly decoded frames among the receive buffers 322(i), utilizing an inverse method to the method used for multiplexing. If all the systematic k frames are correctly decoded by the inner decoder for a particular receive buffer 322(i), the systematic frames from the systematic portion 324(i) of the receive buffer 322(i) are provided to higher layers.

If the inner decoder cannot decode the frame, the decoder declares an erasure, and provides the de-multiplexer 324 with an indication that the frame is missing. The de-multiplexer 324 provides the information to the outer block decoder 328(i) communicatively coupled to the received buffer 322(i) to which the frame belonged. The process continues until there are enough systematic frames and correctly received parity frames accumulated in the systematic portion 324(i) and the parity portion 326(i) of the receive buffer 322(i), or until the receive buffer 322(i) is full. The outer decoder (not shown) is then activated to recover the erased systematic frames. The recovered systematic frames are provided to higher layers.

If the total number of correctly received frames in the receive buffer 322(i) is less than k, in accordance with one embodiment the outer decoder is not activated since there is no guarantee that the decoding would be successful. The correctly received systematic frames together with identification of the missing bits are provided to the higher layers. In another embodiment, the receiver uses decoded bits from the inner decoder (which are unreliable as indicated by the failed CRC checks) to recover bits for the systematic bits. In accordance with one embodiment, the receiver decodes the unreliable bits from the inner decoder and finds the most likely codeword. In the another embodiment, the receiver uses measurement of the signal quality of the erased frames in the buffer to choose enough erroneously received frames with the highest signal to noise ratio to form a sub buffer with k rows. The receiver then performs bit flipping (changing a bit value of 0 to a bit value 1 and vice versa at one column at a time) and checks whether the bit flipping resulted in a codeword. In one embodiment, the bit flipping is first performed on the least reliable bits and continues with bits in the order of the bits' increasing reliability. The reliability of a bit may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. If a codeword was not found, the bit flipping continues through all the remaining columns for all the unreliable rows. If a codeword was not found, the bit flipping continues with increased number of bits flipped (that is, changing 2 bits at a time, then 3 bits, until the maximum number of bits), until either a codeword is found or all combinations are exhausted. In another embodiment, the CRC from the unreliable rows are used to check the overall success of the decoding in this situation. The frames are provided to the higher layers only if the CRC from all rows match; otherwise, only bits from reliable rows are provided to the higher layers.

To improve reliability of decoding, in another embodiment, the demodulation and inner decoding are performed for more than k correctly received frames in a buffer. In accordance in yet another embodiment the demodulation and inner decoding are performed for all frames in the buffer. In both embodiments, the outer decoding is performed on the k (or km) rows with the highest quality. The quality may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. Use of quality metrics for quality estimation is disclosed in detail in U.S. Pat. No. 5,751,725 entitled "METHOD AND APPARATUS FOR DETERMINING THE RATE OF RECEIVED DATA IN A VARIABLE RATE COMMUNICATIONS SYSTEM" and U.S. Pat. No. 5,774,496 entitled "METHOD AND APPARATUS FOR DETERMINING DATA RATE OF TRANSMITTED VARIABLE RATE DATA IN A COMMUNICATIONS RECEIVER" and both are assigned to the assignee of the present invention.

One skilled in the art will appreciate that the number of transmit buffers 304, consequently, receive buffers 322 is a compromise between processing overhead and amount of potential data loss. A small value of k, resulting in more transmit/receive buffers causes increased processing overhead. On the other hand, a large value of k resulting in less transmit/receive buffers causes the transmit buffer size to increase, which leads to discarding a large block of data if the content of the transmit buffer cannot be recovered due to more than (n–k) row erasures. A large transmit buffer size also increases the memory requirement at the destination terminal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. An encoding method for reducing decoding complexity, the method comprising:
    encoding systematic bits of a bit stream in each of a plurality of buffers with a first code, the first code being encoded by an outer encoder;
    multiplexing content of the systematic encoded bits in each of the plurality of buffers from the bit stream; and
    encoding said multiplexed content with a second code to provide a set of frames, wherein the encoding said multiplexed content comprises identifying a block of bits to be encoded and then coding the block of bits with the second code, the second code being encoded by an inner encoder.

2. The method as claimed in claim 1 wherein said encoding systematic bits in each of the plurality of buffers with the first code comprises:
    encoding systematic bits in each of the plurality of buffers with a block code.

3. The method as claimed in claim 2 wherein said encoding systematic bits in each of the plurality of buffers with a block code comprises:
    encoding systematic bits in each of the plurality of buffers with a Reed-Solomon code.

4. The method as claimed in claim 1 wherein said multiplexing content of the plurality of buffers comprises:
    providing a block of bits successively from each of the plurality of buffers.

5. The method claimed in claim 4 wherein said providing the block of bits successively from each of the plurality of buffers comprises:
    providing the block of bits comprising a row of each of the plurality of buffers.

6. The method claimed in claim 1 wherein said identifying the block of bits to be encoded comprises:
    identifying the block of bits received from at least one of the plurality of buffers.

7. A method reducing decoding complexity, comprising:
    decoding received frames by a first decoder;
    de-multiplexing correctly decoded frame to a plurality of buffers, wherein the de-multiplexing comprises identifying a block of bits comprising the correctly decoded frame decoded by the first decoder and belonging to at least one of the plurality of buffers, and further providing the block of bits to at least one of the plurality of buffers;
    processing content of each of the plurality of buffers into a bit stream; and
    providing indication of an erasure to a second decoder communicatively coupled to at least one of the plurality of buffers that would receive the correctly decoded frame if the frame failed to decode correctly.

8. The method as claimed in claim 7 wherein said processing content of each of the plurality of buffers comprises:
    providing systematic portion of each of the plurality of buffers to higher layers.

9. The method as claimed in claim 7 wherein said processing content of each of the plurality of buffers comprises:
decoding the systematic portion of the buffer by the second decoder when the systematic portion is recoverable; and
providing the systematic portion of each of the plurality of buffer to higher layers.

10. A method for reducing decoding complexity, comprising:
encoding systematic bits of a bit stream in each of a plurality of transmit buffers with a first code, the first code being an outer code;
multiplexing content of the plurality of transmit buffers from the bit stream;
encoding said multiplexed content with a second code to provide a set of frames wherein said encoding said multiplexed content comprises identifying a block of bits to be encoded then coding the block of bits with the second code, the second code being an inner code;
transmitting the set of frames;
decoding received frames by a first decoder;
de-multiplexing correctly decoded frame to a plurality of receive buffers; and
processing content of each received buffer.

11. The method as claimed in claim 10 wherein said encoding systematic bits in each of the plurality of transmit buffers with the first code comprises:
encoding systematic bits in each of the plurality of transmit buffers with a block code.

12. The method as claimed in claim 11 wherein said encoding systematic bits in each of the plurality of buffers with the block code comprises:
encoding systematic bits in each of a plurality of buffers with a Reed-Solomon code.

13. The method as claimed in claim 10 wherein said multiplexing content of the plurality of the transmit buffers comprises:
providing a block, of bits successively from each buffer.

14. The method claimed in claim 13 wherein said providing the block of bits successively from each buffer comprises:
providing the block of bits comprising a row of at least one of the plurality of transmitting buffets.

15. The method claimed in claim 10 wherein said identifying the block of bits to be encoded comprises:
identifying the block of bits as the block of bits received from at least one of the plurality of transmit buffers.

16. The method as claimed in claim 10 wherein said de-multiplexing correctly decoded frame to a receive buffers comprises:
identifying a block of bits belonging to at least one of the plurality of receive buffers; and
providing the block of bits to at least one of the plurality of receive buffers.

17. The method as claimed in claim 16 wherein said identifying the block of bits belonging to at least one of the plurality of receive buffers, comprises:
identifying the block of bits as a block of bits comprising a frame decoded by the first decoder.

18. The method as claimed in claim 10 wherein said processing content of each receive buffer comprises:
providing systematic portion of each buffer to higher layers.

19. The method as claimed in claim 10 further comprising:
providing indication of an erasure to a second decoder communicatively coupled to the receive buffer that would receive the correctly decoded frame if the frame failed to decode correctly.

20. The method as claimed in claim 19 wherein said processing content of each buffer comprises:
decoding the systematic portion of at least one of the plurality of receive buffers by the first decoder when the systematic portion is recoverable; and
providing systematic portion of each buffer to higher layers.

21. An apparatus for reducing decoding complexity, comprising:
a plurality of buffers; a plurality of outer encoders, each of said plurality of encoders directly coupled to one of said plurality of buffers wherein said plurality of buffers are configured to receive systematic bits from a bit stream;
a multiplexer directly coupled to said plurality of buffers; and an inner encoder directly coupled to said multiplexer, wherein the inner encoder is configured to identify a block of bits encoded by the outer encoders and encode the block of bits with an inner code.

22. The apparatus as claimed in claim 21 wherein each of said plurality of buffers is configured to:
store systematic bits and parity bits.

23. The apparatus as claimed in claim 21 wherein each of said plurality of encoders is configured to:
encode systematic bits to provide parity bits.

24. The apparatus as claimed in claim 21 wherein each of said plurality of encoders is configured to:
encode the systematic bits with a block code.

25. The apparatus as claimed in claim 21 wherein each of said plurality of encoders is configured to:
encode the systematic bits with a Reed-Solomon code.

26. The apparatus claimed in claim 21 wherein said multiplexer is configured to:
provide a block of bits successively from each of said plurality of buffers to said inner encoder.

27. The apparatus as claimed in claim 26 wherein said block of bits comprises a row of said buffer.

28. The apparatus as claimed in claim 21 wherein said block of bits to be encoded comprises:
a block of bits received from said multiplexer.

29. An apparatus for reducing decoding complexity, comprising:
a first decoder, wherein said first decoder is configured to:
decode a received frame;
provide a correctly decoded frame; and
provide indication of an erasure if the received frame failed to decode correctly;
a de-multiplexer communicatively coupled to said first decoder;
a plurality of buffers communicatively coupled to said de-multiplexer; and
a plurality of decoders, each of said plurality of decoders being communicatively coupled to one of said plurality of buffers each being communicatively coupled to form a bit stream.

30. The apparatus as claimed in claim 29 wherein said de-multiplexer is configured to:
identify a block of bits belonging to at least one of the plurality of buffers; and
provide the block of bits to the buffer.

31. The apparatus as claimed in claim 30 wherein said block of bits belonging to at least one of the plurality of buffers comprises:
the block of bits comprising a frame decoded by said first decoder.

32. The apparatus as claimed in claim 29 wherein each of said plurality of decoders is configured to:

decode the systematic portion of at least one of the plurality of buffers by an outer decoder when the systematic portion is recoverable.

33. The apparatus as claimed in claim 29 wherein each of said plurality of buffers is configured to:
provide systematic portion to higher layers.

34. An apparatus for reducing decoding complexity, comprising:
a plurality of transmit buffers;
a plurality of outer encoders, each of said plurality of encoders being communicatively coupled to one of said plurality of transmit buffers wherein said plurality of transmit buffers are configured to receive systematic bits from a bit stream;
a multiplexer communicatively coupled to said plurality of transmit buffers;
an inner encoder communicatively coupled to said multiplexer, wherein the inner encoder is configured to identify a block of bits to be encoded and to encode the block of bits with an inner code;
a first decoder;
a de-multiplexer communicatively coupled to said first decoder;
a plurality of receive buffers communicatively coupled to said de-multiplexer; and
a plurality of decoders, each of said plurality of decoders being communicatively coupled to one of said plurality of receive buffers.

35. The apparatus as claimed in claim 34 wherein each of said plurality of transmit buffers is configured to:
store systematic bits and parity bits.

36. The apparatus as claimed in claim 34 wherein each of said plurality of encoders is configured to:
encode systematic bits to provide parity bits.

37. The apparatus as claimed in claim 36 wherein each of said plurality of encoders is configured to:
encode the systematic bits with a block code.

38. The apparatus as claimed in claim 34 wherein each of said plurality of encoders is configured to:
encode the systematic bits with a Reed-Solomon code.

39. The apparatus claimed in claim 34 wherein said multiplexer is configured to:
provide a block of bits successively from each of said plurality of transmit buffers to said inner encoder.

40. The apparatus as claimed in claim 39 wherein said block of bits comprises a row of at least one of the plurality of transmit buffers.

41. The apparatus as claimed in claim 34 wherein the block of bits to be encoded comprises:
the block of bits received from said multiplexer.

42. The apparatus as claimed in claim 34 wherein said first decoder is configured to:
decode a received frame;
provide a correctly decoded frame; and
provide indication of an erasure if the received frame failed to decode correctly.

43. The apparatus as claimed in claim 34 wherein said de-multiplexer is configured to:
identify a block of bits belonging to at least one of the plurality of receive buffers; and
provide the block of bits to the buffer.

44. The apparatus as claimed in claim 43 wherein said block of bits belonging to the buffer comprises:
the block of bits comprising a frame decoded by said first decoder.

45. The apparatus as claimed in claim 34 wherein each of said plurality of decoders is configured to:
decode the systematic portion of at least one of the plurality of receive buffers by an outer decoder when the systematic portion is recoverable.

46. The apparatus as claimed in claim 34 wherein each of said plurality of buffers is configured to:
provide systematic portion of at least one of the plurality of receive buffers to higher layers.

* * * * *

UNITED STATES PATENT AND TRADEMARK OFFICE
CERTIFICATE OF CORRECTION

PATENT NO.        : 7,649,829 B2                                              Page 1 of 1
APPLICATION NO.   : 09/976591
DATED             : January 19, 2010
INVENTOR(S)       : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1318 days.

Signed and Sealed this

Twenty-eighth Day of December, 2010

David J. Kappos
*Director of the United States Patent and Trademark Office*